(12) United States Patent
Matsuoka et al.

(10) Patent No.: US 7,795,092 B2
(45) Date of Patent: Sep. 14, 2010

(54) SEMICONDUCTOR DEVICE AND MANUFACTURING METHOD THEREOF

(75) Inventors: Yasuyuki Matsuoka, Yokohama (JP); Masaru Kito, Yokohama (JP); Hideaki Aochi, Kawasaki (JP); Takayuki Okamura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/132,450

(22) Filed: Jun. 3, 2008

(65) Prior Publication Data

US 2009/0001444 A1    Jan. 1, 2009

(30) Foreign Application Priority Data

Jun. 27, 2007    (JP)    ............... 2007-168671

(51) Int. Cl.
*H01L 21/336* (2006.01)
(52) U.S. Cl. ...................... 438/257; 257/314
(58) Field of Classification Search ............... 257/206, 257/235, 249, 250, 314
See application file for complete search history.

(56) References Cited

U.S. PATENT DOCUMENTS

| | | | |
|---|---|---|---|
| 6,469,339 B1* | 10/2002 | Onakado et al. | 257/315 |
| 6,667,502 B1 | 12/2003 | Agarwal et al. | |
| 2002/0036317 A1* | 3/2002 | Matsui et al. | 257/315 |
| 2004/0224476 A1* | 11/2004 | Yamada et al. | 438/400 |
| 2008/0116503 A1* | 5/2008 | Tsurumi et al. | 257/316 |
| 2008/0211004 A1* | 9/2008 | Ozawa et al. | 257/315 |
| 2008/0277713 A1* | 11/2008 | Maekawa | 257/316 |

FOREIGN PATENT DOCUMENTS

| | | |
|---|---|---|
| JP | 2002-9148 | 1/2002 |
| JP | 2006-228893 | 8/2006 |
| JP | 2006-302950 | 11/2006 |
| JP | 2007-501531 | 1/2007 |
| JP | 2007-88283 | 4/2007 |
| JP | 2007-157927 | 6/2007 |
| JP | 3998609 | 8/2007 |
| WO | WO 2004/107352 A2 | 12/2004 |

OTHER PUBLICATIONS

Chunshan Yin, et al., "An Air Spacer Technology for Improving Short-Channel Immunity of MOSFETs With Raised Source/Drain and High-K Gate Dielectric", IEEE Electron Device Letters, vol. 26, No. 5, May 2005, pp. 323-325.
Daewoong Kang, et al., "The Air Spacer Technology for Improving the Cell Distribution in 1 Giga Bit NAND Flash Memory", IEEE, 1-4244-0026-0/06, 2006, 2 pages.

* cited by examiner

*Primary Examiner*—N Drew Richards
*Assistant Examiner*—Grant S Withers
(74) *Attorney, Agent, or Firm*—Oblon, Spivak, McClelland, Maier & Neustadt, L.L.P.

(57) ABSTRACT

A semiconductor memory device includes gate electrodes extending in a first direction above a surface of a substrate. The semiconductor memory device also includes a reinforcement insulation film formed in a line shape and extending in a second direction crossing the gate electrodes in a plane view viewed from above the surface of the substrate, and connected to adjacent gate electrodes. Further, the semiconductor memory device includes an interlayer dielectric film provided between the adjacent gate electrodes, and having a void inside.

3 Claims, 5 Drawing Sheets

SEMICONDUCTOR DEVICE AND MANUFACTURING METHOD THEREOF

CROSS-REFERENCE TO RELATED APPLICATION

This application is based upon and claims the benefit of priority from the prior Japanese Patent Applications No. 2007-168671, filed on Jun. 27, 2007, the entire contents of which are incorporated herein by reference.

BACKGROUND OF THE INVENTION

1. Field of the Invention

The present invention relates to a semiconductor device and a manufacturing method thereof, and relates to a NAND type memory cell and a manufacturing method thereof, for example.

2. Related Art

In NAND memories, there is representatively used an insulation film formed by polysilazane (PSZ), HDP-CVD (High Density Plasma-Chemical Vapor Deposition) or BPSG (Boron-Phosphorous-doped Silicon Glass) as an interlayer dielectric film filling between adjacent gate electrodes. A specific dielectric constant of each of these interlayer dielectric films is relatively low. However, when miniaturization of the semiconductor integrated circuit is progressed and when a gate length becomes 30 nm to 20 nm, there occur (1) a disturbance (threshold variation) due to a parasitic capacitance between adjacent floating gate electrodes, and (2) a disturbance (error writing) of a control electrode of a certain memory cell, inverting a channel of an adjacent memory cell. These problems of disturbances become a malfunction of the memory device.

SUMMARY OF THE INVENTION

A semiconductor memory device according to an embodiment of the present invention comprises a plurality of gate electrodes extending to a first direction; a reinforced insulation film extending to a second direction crossing the first direction, and connected to the adjacent gate electrodes; and an interlayer dielectric film provided between the adjacent gate electrodes, and having a void inside.

A method of manufacturing a semiconductor memory device according to an embodiment of the present invention comprises forming a plurality of gate electrodes extending to a first direction; forming a reinforced insulation film extending to a second direction crossing the first direction, and connected to the adjacent gate electrodes; and depositing an interlayer dielectric film so as to have a void between the adjacent gate electrodes and beneath the reinforced insulation film.

A method of manufacturing a semiconductor memory device according to an embodiment of the present invention comprises forming a first gate dielectric film on a semiconductor substrate, a floating gate on the first gate dielectric film, a second gate dielectric film on the floating gate, and a control gate on the second gate dielectric film, the first gate dielectric film, the floating gate, the second gate dielectric film, and the control gate being formed in a stripe shape; depositing a first interlayer dielectric film between the adjacent floating gates and between the adjacent control gates; depositing a reinforced insulation film on the upper surface of the control gate, and on the upper surface of the first interlayer dielectric film, respectively; processing in a stripe shape the reinforced insulation film so as to extend to a direction crossing the extension direction of the control gate; removing the first interlayer dielectric film through a gap of the stripe of the reinforced insulation film; and depositing a second interlayer dielectric film having poorer covering properties than that of the first interlayer dielectric film to block the upper part between the adjacent control gates and the upper part of the gap of the stripe of the reinforced insulation films before a region between the floating gates and a region beneath the reinforced insulation film are filled.

DETAILED DESCRIPTION OF THE INVENTION

Embodiments of the present invention will be explained below in detail with reference to the accompanying drawings. Note that the invention is not limited thereto.

Figure 1A:
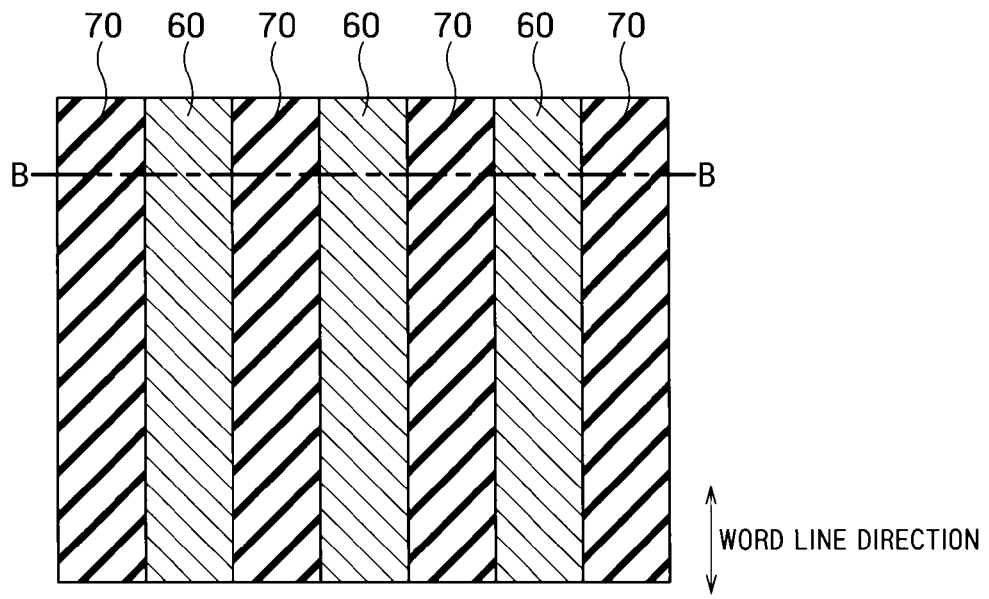
FIG. 1A is a top plan view showing a manufacturing method of a NAND type memory according to an embodiment of the present invention.
Figure 1B:
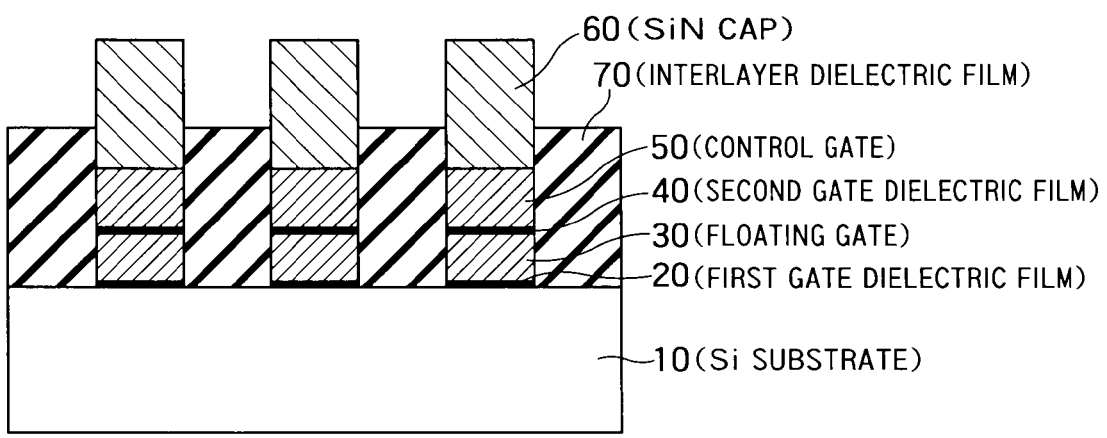
FIG. 1B is a cross-sectional view showing a manufacturing method of a NAND type memory according to an embodiment of the present invention.

FIG. 1A to FIG. 5 are top plan views and cross-sectional views showing a manufacturing method of a NAND type memory according to an embodiment of the present invention. FIG. 1A is a top plan view showing a memory region. FIG. 1B is a cross-sectional view along a line B-B in FIG. 1A. First, as shown in FIG. 1B, a first gate dielectric film 20 and a floating gate electrode 30 are formed in a line shape (a stripe shape) on a silicon substrate 10. The first gate dielectric film 20 includes a silicon oxide film, a silicon oxynitride film, or a high dielectric material having a higher specific dielectric constant than that of the silicon oxynitride film, or a lamination film of these films. The floating gate electrode 30 includes doped polysilicon, for example. The floating gate electrode 30 is formed on a channel region of each memory cell, and is in an electrically floating state.

A second gate dielectric film 40 is formed on the floating gate electrode 30. A control gate electrode 50 is formed on the second gate dielectric film 40. The second gate dielectric film 40 includes a silicon oxide film, a silicon oxynitride film, or a high dielectric material having a higher specific dielectric constant than that of the silicon oxynitride film, or a lamination film of these films, for example. The control gate electrode 50 includes doped polysilicon, for example.

The control gate electrode 50 is formed by performing RIE (Reactive Ion Etching) by using both or either one of an SiN cap 60 and a silicon oxide film (not shown) on the SiN cap 60 as a mask. The control gate electrode 50 is extended to a word line direction (a first direction), as shown in FIG. 1A. That is, the control gate electrode 50 is formed in a plural-line shape (a stripe shape). The control gate electrode 50 functions not only as a control gate of a memory cell but also as a word line.

Next, an interlayer dielectric film 70 is deposited. The interlayer dielectric film 70 is ground using CMP (Chemical Mechanical Polishing) until when the upper surface of the SiN cap 60 is exposed. The interlayer dielectric film 70 is etched back to the medium of the SiN cap 60. In this case, the upper surface of the interlayer dielectric film 70 is higher than the upper surface of the control gate electrode 50, and is lower than the upper surface of the SiN cap 60, with the surface of the silicon substrate 10 as a reference.

Figure 2:
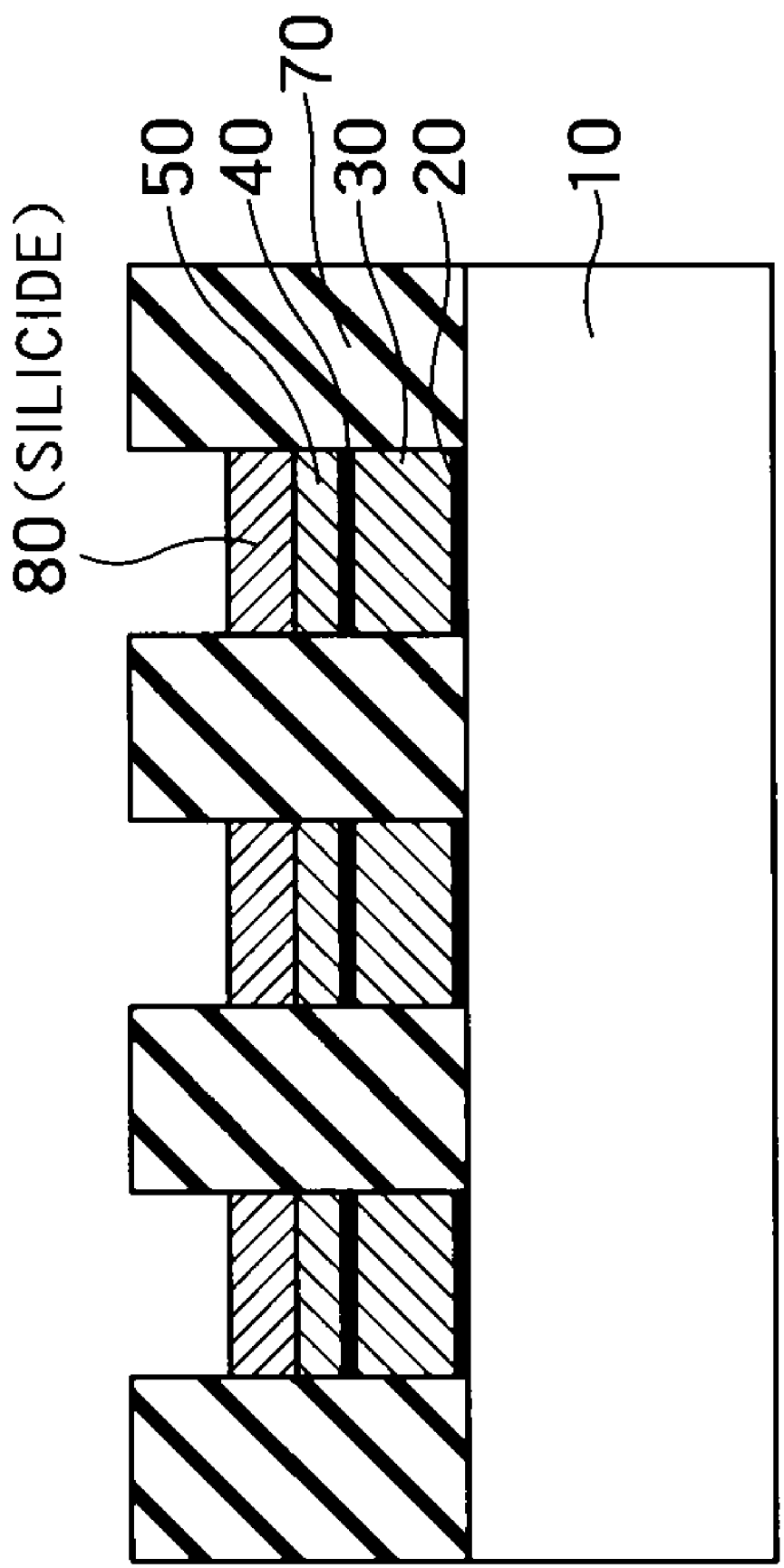
FIG. 2 is a cross-sectional view showing a manufacturing method following FIG. 1B.

Next, the SiN cap 60 is removed with hot-phosphoric solution. Accordingly, the upper surface of the control gate electrode 50 is exposed. Next, a metal film such as nickel, cobalt, or titanium is deposited on the control gate electrode 50. Next, the deposited result is heat-treated using RTA (Rapid Thermal Anneal), thereby reacting the metal film with the control gate electrode 50. Accordingly, as shown in FIG. 2, a silicide layer 80 is formed as a part of the control gate electrode 50 on the control gate electrode 50. The silicide layer 80 plays a role of decreasing gate resistance (resistance of a word line). Thereafter, an unreacted metal film is removed by wet etching.

Figure 3A:
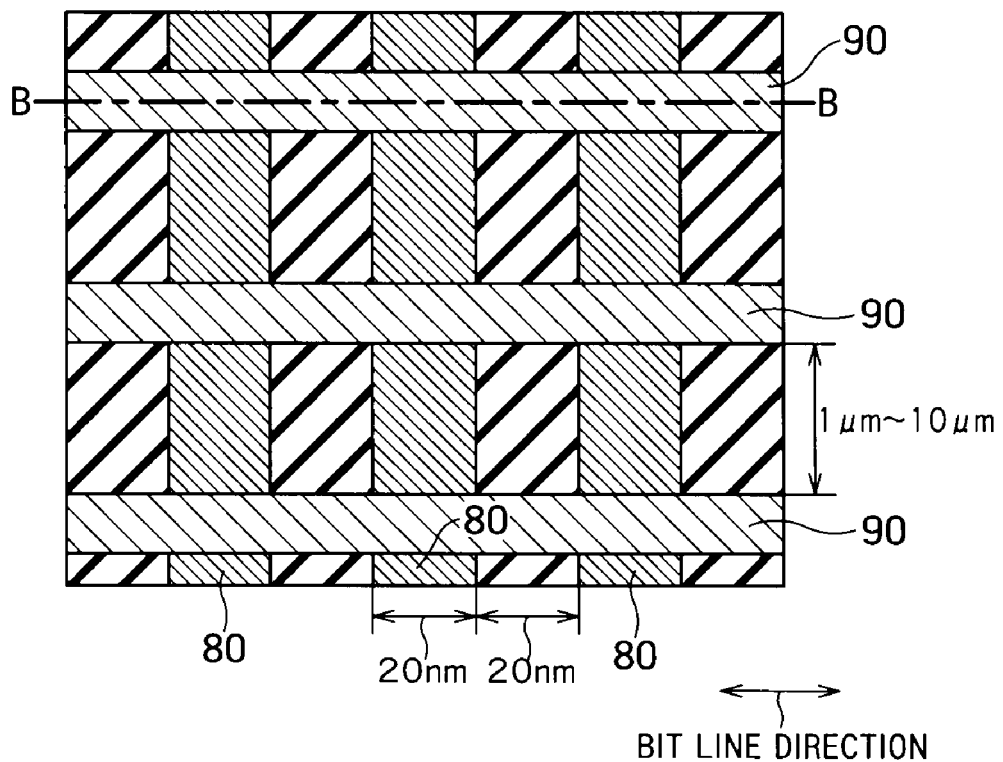
FIG. 3A is a top plan view showing a manufacturing method following FIG. 2.
Figure 3B:
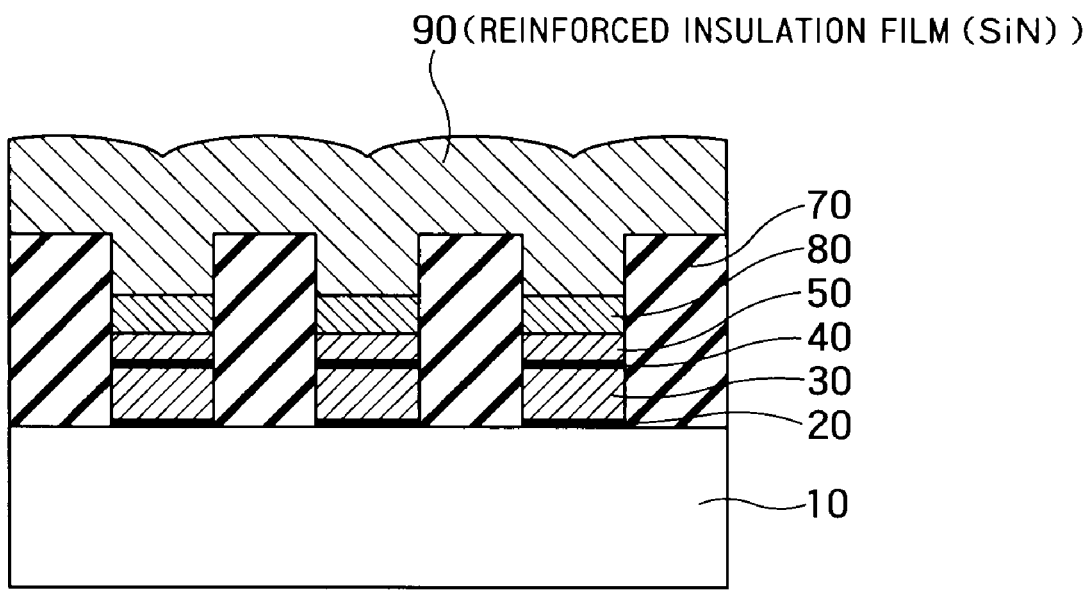
FIG. 3B is a cross-sectional view showing a manufacturing method following FIG. 2.

Next, as shown in FIG. 3B, a reinforced insulation film material 90 is deposited on the silicide layer 80 and the interlayer dielectric film 70. Preferably, the reinforced insulation film material 90 has low specific dielectric constant, and has high mechanical strength. For example, the reinforced insulation film material 90 includes a silicon nitride film. The reinforced insulation film material 90 is patterned to extend to a bit line direction (a second direction) by using lithography and RIE. The bit line direction is orthogonal with the word line direction. Accordingly, as shown in FIG. 3A, the reinforced insulation film 90 is formed in a plural-line shape (a stripe shape) extending to a direction orthogonal with the control gate electrode 50. The reinforced insulation film material 90 after the RIE process is called the reinforced insulation film 90. FIG. 3B is a cross-sectional view along a line B-B in FIG. 3A.

Figure 4A:
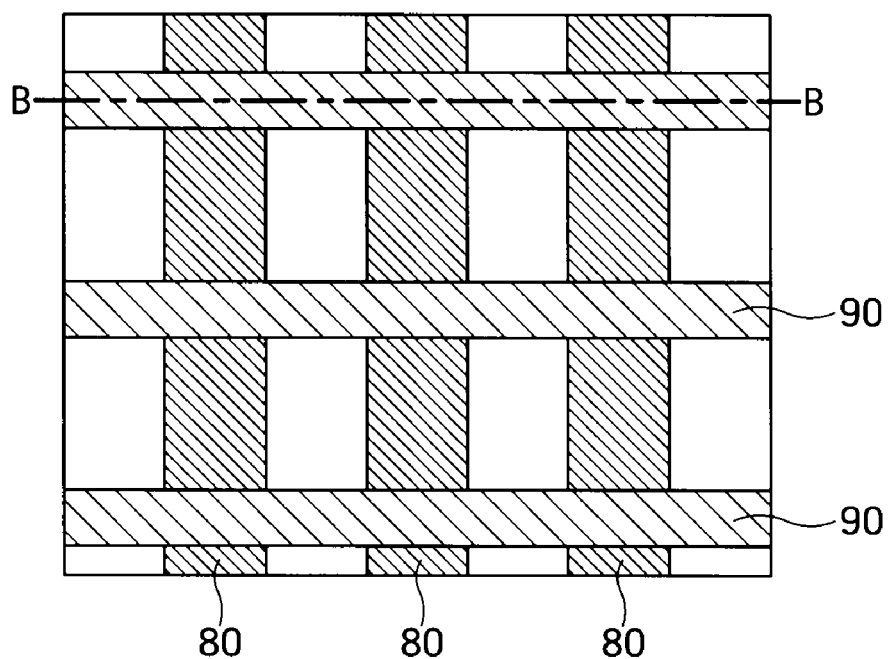
FIG. 4A is a top plan view showing a manufacturing method following FIG. 3A.

Next, as shown in FIG. 4A, the interlayer dielectric film 70 is removed by wet treating. Accordingly, the interlayer dielectric film 70 between the adjacent control gate electrodes 50, the interlayer dielectric film 70 between the adjacent floating gate electrodes 30, and the interlayer dielectric film 70 beneath the reinforced insulation film 90 are all removed. The reinforced insulation film 90 is connected to the upper surface of the silicide layers 80 adjacent in a bit line direction. The reinforced insulation film 90 physically connects between the control gate electrode 50 and the floating gate electrode 30 adjacent in the bit line direction, and reinforces these electrodes. Accordingly, even when the aspect ratio of the control gate electrode 50 and the floating gate electrode 30 becomes high, the reinforced insulation film 90 physically supports the control gate electrode 50 and the floating gate electrode 30 adjacent in the bit line direction, thereby preventing the control gate electrode 50 and the floating gate electrode 30 from being destructed.

Figure 4B:
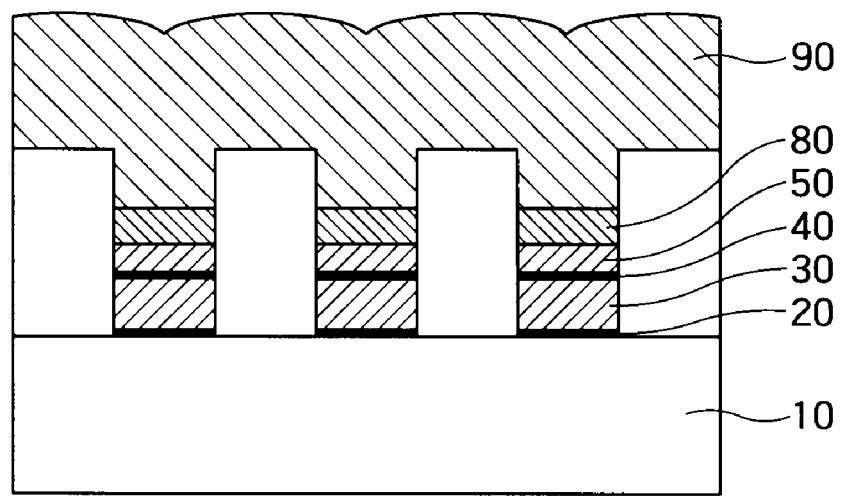
FIG. 4B is a cross-sectional view showing a manufacturing method following FIG. 3B.
Figure 5:
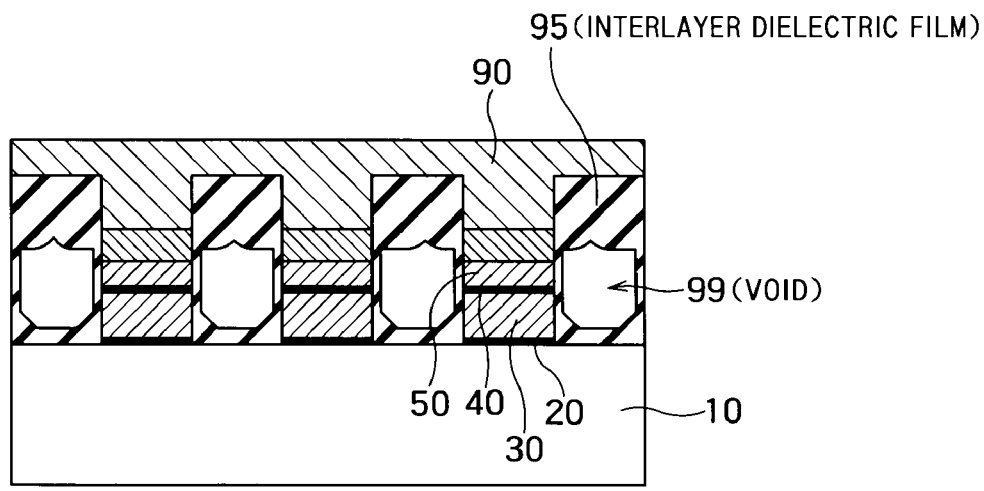
FIG. 5 is a cross-sectional view showing a manufacturing method following FIG. 5.
Figure 6:
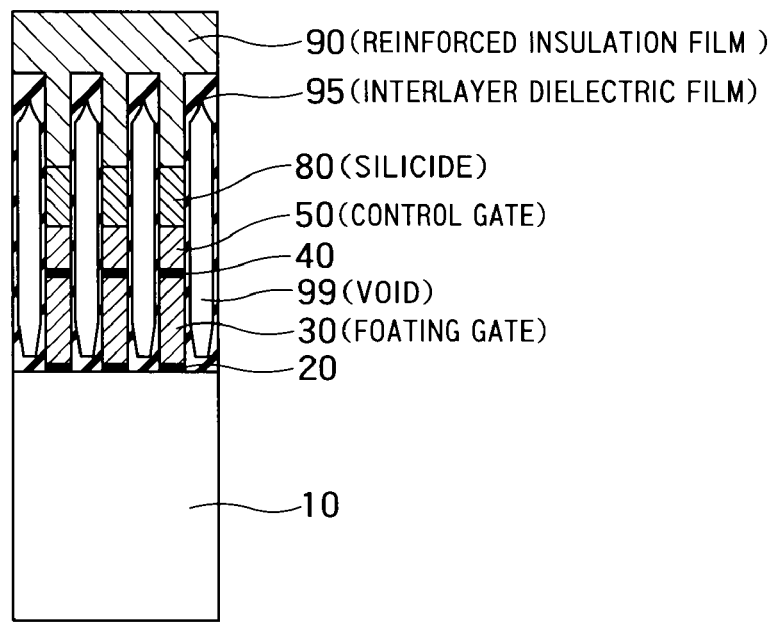
FIG. 6 is a cross-sectional view showing an actual aspect ratio of the control gate electrode and the floating gate electrode.

When the gate length becomes 30 nm to 20 nm based on the miniaturization of the semiconductor memory device, the aspect ratio of the control gate electrode and the floating gate electrode becomes equal to or larger than five. In FIG. 1A to FIG. 5B, to facilitate the understanding, the aspect ratio of the control gate electrode and the floating gate electrode is shown smaller than the actual size. When the aspect ratio of the control gate electrode and the floating gate electrode becomes equal to or larger than five, as shown in FIG. 6, the control gate electrode and the floating gate electrode become actually in a very slender shape. The control gate electrode and the floating gate electrode having such a slender shape are actually easily destructed in the manufacturing process.

In the present embodiment, the reinforced insulation film 90 is connected in a beam shape to the upper surface of the plural control gate electrodes 50 (the silicide layer 80) adjacent in the bit line direction, thereby physically supporting the control gate electrode 50 and the floating gate electrode 30. Accordingly, as shown in FIG. 4B, even when the interlayer dielectric film 70 is removed, the control gate electrode 50 and the floating gate electrode 30 can be prevented from being destructed.

In the peripheral circuit region at this stage, the reinforced insulation film 90 covers the whole surface of this region. Therefore, in the peripheral circuit region, the interlayer dielectric film 70 protects the element.

Next, an interlayer dielectric film 95 having poor covering properties is deposited using PECVD (Plasma Enhanced Chemical Vapor Deposition) or the like. As the interlayer dielectric film 95 having poor covering properties, a PTEOS (Plasma-tetraethoxysilane) film or the like is available. When this interlayer dielectric film 95 is deposited, the upper parts of the control gate electrodes 50 and the upper parts of the adjacent reinforced insulation films 90 are blocked by the interlayer dielectric film 95, before the region between the adjacent control gate electrodes 50, the region between the adjacent floating gate electrodes 30, and the region beneath the reinforced insulation film 90 are filled in. Accordingly, as shown in FIG. 5, the interlayer dielectric film 95 having a void 99 in the center is formed both or either one of between the adjacent control gate electrodes 50 and between the adjacent floating gate electrodes 30. The actual aspect ratio of the control gate electrode 50 and the floating gate electrode 30 is larger than that shown in FIG. 5. Therefore, it is easy to deposit the interlayer dielectric film 95 to have the void 99 in the center. The interlayer dielectric film 95 is deposited to a height equal to or higher than the upper surface of the reinforced insulation film 90.

Next, the interlayer dielectric film 95 and the reinforced insulation film 90 are flattened using CMP, thereby obtaining a structure as shown in FIG. 5. In the peripheral circuit region, the reinforced insulation film 90 covers the whole surface. Therefore, there is fear that the memory region is dished in this CMP process. However, in the present embodiment, because the reinforced insulation film 90 is provided, the reinforced insulation film 90 suppresses the dishing of the memory region. The CMP is performed so that the void 99 does not appear on the upper surface. Therefore, after the CMP process, only the upper surface of the reinforced insulation film 90 and the upper surface of the interlayer dielectric film 95 appear. The upper surface of the reinforced insulation film 90 and the upper surface of the interlayer dielectric film 95 are on the same flat surface. Accordingly, the subsequent process becomes easy.

Although not shown, thereafter, the reinforced insulation film 90 covering the peripheral circuit region is removed. Then, contacts and wirings (bit lines) are formed using the conventional process, thereby completing the NAND type memory according to the present embodiment. By leaving the reinforced insulation film 90 in the peripheral circuit region, etching conditions for forming the contacts can be changed to etch the reinforced insulation film 90 at the time of forming the contacts.

In the present embodiment, the NAND type memory includes the plural control gate electrodes 50 extending to the word line direction, the reinforced insulation film 90 extending to the bit line direction orthogonal with the word lines and connected to the adjacent control gate electrodes 50, and the interlayer dielectric films 95 provided between the adjacent control gate electrodes 50 and between the adjacent floating gate electrodes 30 and having the voids 99 inside. The memory cell includes the control gate electrodes 50 and the floating gate electrodes 30, and stores a charge tunneling the first gate dielectric film 20 in the floating gate electrode 30, or discharges the charge from the floating gate electrode 30 via the first gate dielectric film 20, thereby storing logic data. The memory cell can store data by accumulating a charge having an opposite polarity to that of the charge originally stored in the floating gate electrode 30.

Because the void 99 is provided between the control gate electrode 50 and the floating gate electrode 30, the coupling capacitance between the adjacent control gate electrodes 50 and the coupling capacitance between the adjacent floating gate electrodes 30 decrease. Further, the influence that the control gate electrodes 50 apply to the channel regions of the adjacent cells also decrease. As a result, even when the memory device is miniaturized, the memory device according to the present embodiment can suppress (1) the disturbance due to the parasitic capacitance between the adjacent floating gate electrodes, and (2) the disturbance in which the control gate electrode of a certain memory cell inverts a channel of an adjacent memory cell.

In the present embodiment, because the reinforced insulation film 90 physically reinforces the control gate electrodes 50 and the floating gate electrodes 30, the control gate electrodes 50 and the floating gate electrodes 30 can be prevented from being destructed. Further, the reinforced insulation film 90 can suppress the dishing in the process of flattening the interlayer dielectric film 95.

The effect of the present embodiment is more advantageously exhibited when the design rule is strict and also when the aspect ratio of the gate electrode is large. For example, when the gate length is equal to or smaller than 30 nm and also when the aspect ratio of the control gate electrode and the floating gate electrode is equal to or larger than five, the effect of the present embodiment can be exhibited effectively. The effect of the present embodiment is not denied even when the gate length is larger than 30 nm and also when the aspect ratio of the control gate electrode and the floating gate electrode is smaller than five.

While the present embodiment is applied to the floating gate type memory, the present embodiment can be also applied to the MONOS (Metal-Oxide-Nitride-Oxide-Semiconductor) type memory. The MONOS type memory has a floating gate part formed by a silicon nitride film.

The invention claimed is:

1. A method of manufacturing a semiconductor memory device, comprising:
    forming a first gate dielectric film on a semiconductor substrate, a floating gate on the first gate dielectric film, a second gate dielectric film on the floating gate, and a control gate on the second gate dielectric film, the first gate dielectric film, the floating gate, the second gate dielectric film, and the control gate being formed in a stripe shape;
    depositing a first interlayer dielectric film between adjacent floating gates and between adjacent control gates;
    depositing a reinforcement insulation film on an upper surface of the control gate, and on an upper surface of the first interlayer dielectric film, respectively;
    processing in a stripe shape the reinforcement insulation film so as to extend to a direction crossing an extension direction of the control gate;
    removing the first interlayer dielectric film through a gap of a stripe of the reinforcement insulation film; and
    depositing a second interlayer dielectric film having poorer covering properties than that of the first interlayer dielectric film to block a region between an upper part of the adjacent control gates and an upper part of the gap of the stripe of the reinforcement insulation films before a region between the floating gates and a region beneath the reinforcement insulation film are filled.

2. The method of manufacturing a semiconductor memory according to claim 1, wherein the reinforcement insulation film is formed by a silicon nitride film.

3. The method of manufacturing a semiconductor memory according to claim 1, wherein the semiconductor memory device is a NAND type memory.

* * * * *